United States Patent
Ma et al.

(10) Patent No.: US 10,917,114 B2
(45) Date of Patent: Feb. 9, 2021

(54) DATA TRANSMISSION METHOD, SENDING DEVICE, RECEIVING DEVICE, AND COMMUNICATIONS SYSTEM

(71) Applicant: Huawei Technologies Co., Ltd., Shenzhen (CN)

(72) Inventors: Liang Ma, Shanghai (CN); Chen Zheng, Shanghai (CN); Jie Xiong, Shanghai (CN); Xin Zeng, Shenzhen (CN); Xiaojian Liu, Shenzhen (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/433,985

(22) Filed: Jun. 6, 2019

(65) Prior Publication Data
US 2019/0288708 A1    Sep. 19, 2019

Related U.S. Application Data

(63) Continuation of application No. PCT/CN2017/114637, filed on Dec. 5, 2017.

(30) Foreign Application Priority Data

Dec. 7, 2016 (CN) .......................... 2016 1 1117610
Jan. 20, 2017 (CN) .......................... 2017 1 0042967

(51) Int. Cl.
*H03M 13/11* (2006.01)
*H04L 1/00* (2006.01)
(Continued)

(52) U.S. Cl.
CPC ........ *H03M 13/118* (2013.01); *H03M 13/116* (2013.01); *H03M 13/1111* (2013.01);
(Continued)

(58) Field of Classification Search
CPC ......... H03M 13/6306; H03M 13/3769; H03M 13/118; H03M 13/6393; H03M 13/116;
(Continued)

(56) References Cited

U.S. PATENT DOCUMENTS

2008/0320353 A1    12/2008    Blankenship et al.
2009/0204868 A1    8/2009    Park et al.
(Continued)

FOREIGN PATENT DOCUMENTS

CN    101183875 A    5/2008
CN    101188428 A    5/2008
(Continued)

OTHER PUBLICATIONS

Gallager, "Low-Density Parity-Check Codes," pp. 1-8, IRE Transactions on Information Theory (1962).
(Continued)

*Primary Examiner* — Guy J Lamarre
(74) *Attorney, Agent, or Firm* — Leydig, Voit & Mayer, Ltd.

(57) ABSTRACT

This application discloses a data transmission method, a sending device, a receiving device, and a communications system. The sending device is configured to send a first transport block. The sending device obtains a coded bit segment from a first encoded code block. The first encoded code block is obtained after LDPC encoding is performed on a first code block in the first transport block based on a processing capability of the receiving device. The sending device sends the coded bit segment to the receiving device. Because the processing capability of the receiving device is considered, storage overheads of the sending device or the receiving device can be reduced, encoding or decoding complexity can be reduced, and a decoding success rate can be improved.

16 Claims, 5 Drawing Sheets

(51) Int. Cl.
  *H03M 13/00* (2006.01)
  *H03M 13/37* (2006.01)
  *H04L 1/18* (2006.01)

(52) U.S. Cl.
  CPC ... *H03M 13/3769* (2013.01); *H03M 13/6306* (2013.01); *H03M 13/6393* (2013.01); *H04L 1/0013* (2013.01); *H04L 1/0041* (2013.01); *H04L 1/0045* (2013.01); *H04L 1/0057* (2013.01); *H04L 1/18* (2013.01)

(58) Field of Classification Search
  CPC .............. H03M 13/1111; H04L 1/0057; H04L 1/0013; H04L 1/0041; H04L 1/0045; H04L 1/18
  See application file for complete search history.

(56) References Cited

U.S. PATENT DOCUMENTS

| | | | |
|---|---|---|---|
| 2010/0088570 | A1 | 4/2010 | Choi et al. |
| 2011/0239075 | A1 | 9/2011 | Xu et al. |
| 2012/0087396 | A1 | 4/2012 | Nimbalker et al. |
| 2016/0164537 | A1* | 6/2016 | Pisek ................ H03M 13/1154 714/755 |
| 2017/0033806 | A1* | 2/2017 | Arslan ................ G06F 3/0689 |

FOREIGN PATENT DOCUMENTS

| | | |
|---|---|---|
| CN | 101325474 A | 12/2008 |
| CN | 101682486 A | 3/2010 |
| JP | 2010529756 A | 8/2010 |
| WO | 2009094805 A1 | 8/2009 |
| WO | 2017131813 A1 | 8/2017 |

OTHER PUBLICATIONS

"LDPC Code Design for NR," 3GPP TSG RAN WG1 Meeting #86, R1-166929, Gothenburg, Sweden, pp. 1-10, 3rd Generation Partnership Project, Valbonne, France (Aug. 22-26, 2016).

"Rate Matching for LDPC Codes," 3GPP TSG RAN WG1 Meeting #87, R1-1611322, Reno, USA, pp. 1-6, 3rd Generation Partnership Project, Valbonne, France (Nov. 14-18, 2016).

"Design of LDPC Codes for NR," 3GPP TSG RAN WG1 Meeting #87 Reno, USA, R1-1611321, pp. 1-11, 3rd Generation Partnership Project, Valbonne, France (Nov. 14-18, 2016).

* cited by examiner

FIG. 1

DATA TRANSMISSION METHOD, SENDING DEVICE, RECEIVING DEVICE, AND COMMUNICATIONS SYSTEM

CROSS-REFERENCE TO RELATED APPLICATIONS

This application is a continuation of International Application No. PCT/CN2017/114637, filed on Dec. 5, 2017, which claims priority to Chinese Patent Application No. 201710042967.X, filed on Jan. 20, 2017, and Chinese Patent Application No. 201611117610.5, filed on Dec. 7, 2016. All of the aforementioned patent applications are hereby incorporated by reference in their entireties.

TECHNICAL FIELD

Embodiments of the present invention relate to the communications field, and in particular, to a data transmission method, a sending device, a receiving device, and a communications system.

BACKGROUND

In a communications system, because a wireless propagation environment is complex and volatile, transmitting information data between a sending device (such as a base station or a terminal) and a receiving device (such as a terminal or a base station) is susceptible to interference and easily encounters an error. To reliably send the information data, the sending device performs processing such as a CRC check, channel coding, rate matching, and interleaving on the information data, maps interleaved coded bits to modulation symbols, and sends the modulation symbols to the receiving device. After receiving the modulation symbols, the receiving device correspondingly restores the modulation symbol to the information data through de-interleaving, rate dematching, decoding, and a CRC check. These processes may reduce transmission errors, and improve data transmission reliability.

Low-density parity-check (LDPC) code is a type of linear block code having a sparse check matrix, and has the following features: a flexible structure and low decoding complexity. Because the low-density parity-check code uses a partially parallel iterative decoding algorithm, a throughput rate of the low-density parity-check code is higher than that of conventional Turbo code. The LDPC code is considered as next-generation error-correcting code of the communications system, and can be used to improve channel transmission reliability and power utilization. In addition, the LDPC code may be widely applied to space communications, fiber optic communications, personal communications systems, ADSL, magnetic recording devices, and the like. Currently, the LDPC code has been considered as one of channel coding schemes in $5^{th}$ Generation mobile communications.

LDPC code commonly used in the communications system has a special structured feature, and a base matrix of the LDPC code has m×n elements. If z is used as an lifting factor for lifting, an obtained parity check matrix H has a size of (m×z)×(n×z). In other words, the parity check matrix H includes m×n block matrices, and each block matrix is obtained by circularly shifting a z×z identity matrix. The lifting factor z is usually determined based on code block sizes supported by the system and size of the information data. FIG. 1 shows a base matrix that is of LDPC code having a QC structure and for which m=13 and n=38, and a code rate of the base matrix is (n−m)/n=0.6579. If the lifting factor z is equal to 4, each element whose value is −1 in the matrix is replaced by a 4*4 all-zero matrix, and each of other elements is replaced by a 4×4 circular permutation matrix. A circular permutation matrix may be obtained by circularly shifting an identity matrix I a corresponding quantity of times, and the times of circularly shifting is equal to a value of a corresponding matrix element. As shown in FIG. 1, a circular permutation matrix corresponding to an element whose value is 0 in the base matrix and obtained by lifting is a 4×4 identity matrix I, a circular permutation matrix corresponding to an element whose value is 1 in the base matrix is obtained by circularly shifting the identity matrix once, and so on. Details are not described herein.

The lifted base matrix may be used as a parity check matrix for LDPC coding. LDPC code whose code length is n and information sequence length is k is marked as (n, k), and may be uniquely determined by a parity check matrix H. The parity check matrix H is a sparse matrix. Each row of the parity check matrix H represents one parity check equation constraint, and corresponds to j coded bits. Each column represents that one coded bit is constrained by m parity check equations, and any two parity check equations include at most one same coded bit. The following formular (1) provides a parity check matrix H of LDPC code and an example of parity check equations corresponding to the parity check matrix H.

$$H = \begin{matrix} v_0\ v_1\ v_2\ v_3\ v_4\ v_5\ v_6\ v_7\ v_8\ v_9 \\ \begin{Bmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 1 & 0 & 0 & 1 \\ 0 & 0 & 0 & 1 & 0 & 0 & 0 & 1 & 1 & 1 \end{Bmatrix} \begin{matrix} c_0 \\ c_1 \\ c_2 \\ c_3 \\ c_4 \end{matrix} \end{matrix} \rightarrow \begin{cases} v_0 + v_1 + v_2 + v_3 = 0 \\ v_0 + v_4 + v_5 + v_6 = 0 \\ v_1 + v_4 + v_7 + v_8 = 0 \\ v_2 + v_5 + v_6 + v_9 = 0 \\ v_3 + v_7 + v_8 + v_9 = 0 \end{cases} \quad (1)$$

The parity check matrix H may also be represented by using a Tanner graph. Each column in the matrix H may be used as a variable node, which corresponds to one coded bit. Columns are respectively $v_0, v_1, \ldots,$ and $v_9$ in the foregoing example. Each row in the matrix H may be used as a check node, and rows are respectively $c_0, c_1, \ldots,$ and $c_4$ in the foregoing example. Each connection line between a check node and a variable node may represent that a non-zero element exists at a location at which a row corresponding to the check node and a column corresponding to the variable node intersect.

A parity check matrix of LDPC code shown in FIG. 2 is used as an example, and includes a core matrix and three extended matrix parts. Information data may be separately encoded and decoded by using four parity check matrices: the core matrix, a parity check matrix 1 including the core matrix and an extended matrix part 1, a parity check matrix 2 including the core matrix, the extended matrix part 1, and an extended matrix part 2, and a complete matrix including the core matrix, the extended matrix part 1, the extended matrix part 2, and a extended matrix part 3. These parity check matrices have Raptor-like structures, that is parity bits comprise two structures: a bidiagonal structure and a column-weight−1 structure. If a quantity of to-be-encoded information bits is k and a code length of an LDPC encoded code block generated based on the parity check matrix is n, then a code rate is k/n. LDPC encoded code blocks having different code rates may be obtained by performing encoding by using different parity check matrices. It may be learned that LDPC code generated based on the complete matrix has a maximum code length and a minimum code rate $R_{min}$, LDPC code generated based on the core matrix has a minimum code length and a maximum code rate $R_{max}$, LDPC code generated based on the parity check matrix 1 has a code rate $R_1$, and LDPC code generated based on the parity check matrix 2 has a code rate $R_2$. Therefore, $R_{min} < R_2 < R_1 < R_{max}$. It should be noted that, in the foregoing example, the complete matrix, the core matrix, the parity check matrix 1, or the parity check matrix 2 may be used as a matrix obtained after a base matrix of the LDPC code is lifted based on a lifting factor.

Base matrices having different code rates may be selected to perform LDPC encoding. However, after a same base matrix is lifted, encoding and decoding may be performed by selecting parity check matrices in different sizes. A larger parity check matrix leads to more coded bits generated after the information data is encoded and a lower code rate of the parity check matrix. Storage overheads and decoding complexity of a receiving device also substantially increase.

SUMMARY

In view of this, embodiments of the present invention provide a data transmission method, a sending device, a receiving device, and a communications system, to reduce storage overheads of the sending device or the receiving device, reduce encoding or decoding complexity, and improve a decoding success rate when LDPC is used as a channel coding scheme.

According to a first aspect, a data transmission method is provided, applied to a communications system using low-density parity-check LDPC code, where the communications system includes a sending device and a receiving device, the sending device is configured to send a first transport block, the first transport block includes a first code block, and the method includes:

obtaining, by the sending device, a coded bit segment from a first encoded code block, where the first encoded code block is obtained after the first code block is processed based on a processing capability of the receiving device; and sending, by the sending device, the coded bit segment to the receiving device.

Because the sending device determines a size of an encoded code block based on the processing capability of the receiving device, and selects a to-be-sent coded bit segment, storage overheads of the receiving device can be reduced, and decoding complexity of the receiving device can be reduced.

According to a second aspect, a data transmission method is provided, applied to a communications system using low-density parity-check LDPC code, where the communications system includes a sending device and a receiving device, the sending device is configured to send a first transport block, the first transport block includes a first code block, and the method includes:

receiving, by the receiving device, a coded bit segment from the sending device;

combining, by the receiving device, soft channel bits of the coded bit segment with a soft buffer of the receiving device and saving the combined soft channel bits of the coded bit segment; and performing, by the receiving device, LDPC decoding on the soft buffer to obtain the first code block, where the coded bit segment is obtained by the sending device from a first encoded code block, and the first encoded code block is obtained after the sending device processes the first code block based on a processing capability of the receiving device.

Because the sending device determines a size of an encoded code block based on the processing capability of the receiving device, and selects a to-be-sent coded bit segment, and the receiving device performs decoding after receiving the coded bit segment, storage overheads of the receiving device can be reduced, and decoding complexity of the receiving device can be reduced.

In the foregoing aspect, the processing capability of the receiving device includes a maximum transport block size $N_{IR}$ that can be supported by the soft buffer of the receiving device, then a size of the first encoded code block is $$N_{CB} = \min\left(K_W, \left\lfloor \frac{N_{IR}}{C} \right\rfloor\right),$$

where the first transport block includes C code blocks, and a size of a circular buffer of the sending device is $K_w$; or the processing capability of the receiving device includes a minimum code rate $R_t$ supported by the receiving device for decoding, then a size of the first encoded code block is $$N_{CB} = \min\left(K_W, \left\lfloor \frac{K_{IR,send}}{C \cdot R_t} \right\rfloor\right),$$

where $K_{IR,send}$ is a size of the first transport block, the first transport block includes C code blocks, and a size of a circular buffer of the sending device is $K_w$; or the processing capability of the receiving device includes a maximum encoded code block size $N_{CB,t}$ supported by the receiving device, then a size of the first encoded code block is $N_{CB} = \min(K_w, N_{CB,t})$, where a size of a circular buffer of the sending device is $K_w$.

The sending device may determine a size of an encoded code block based on different processing capabilities of the receiving device. This may implement flexible control.

In a possible implementation of the foregoing aspect, a first start position $S_i$ of the coded bit segment having a length of $n_i$ in the first encoded code block is determined based on a redundancy version $RV_j$, where i is an integer greater than or equal to 0, when i is 0, it indicates initial transmission, and when i is greater than 0, it indicates the $i^{th}$ retransmission; and j is an integer, and $0 \leq j < j_{max}$, where $j_{max}$ is a maximum quantity of redundancy versions between the sending device and the receiving device, start position s corresponding to the $j_{max}$ redundancy versions are distributed in the first encoded code block at an equal interval, a start position of $RV_0$ is a position of bit p in the first encoded code block, and p is an integer greater than or equal to 0.

In another possible implementation of the foregoing aspect, a first start position $S_i$ of the coded bit segment having a length of $n_i$ in the first encoded code block is determined based on a start position $S_{i-1}$ corresponding to an obtained coded bit segment that is previously sent and a length $n_{i-1}$ of the obtained coded bit segment that is previously sent, where a start position $S_0$ of initial transmission is a position of bit p of the first encoded code block; or a first start position $S_i$ of the coded bit segment having a length of $n_i$ in the first encoded code block is determined based on a start position $S_0$ of initial transmission, a length $n_0$ of an initially transmitted coded bit segment, and a quantity i of retransmission times, where the start position $S_0$ of initial transmission is a position of bit p of the first encoded code block.

Optionally, p=z·l, where z is an lifting factor of an LDPC parity check matrix corresponding to the first encoded code block, l is a positive integer, and optionally, l may be one of 1, 2, or 3.

In the foregoing implementation, a start position of a coded bit segment for an initial transmission or retransmission may be flexibly determined.

In the foregoing implementation, position s of the soft channel bits in the soft buffer of the receiving device are in a one-to-one correspondence with positions of bits of the coded bit segment in the first encoded code block.

In any implementation of the foregoing aspect, optionally, the sending device may flexibly select a matrix used for encoding, to match the size of the first encoded code block, and the first encoded code block is obtained by performing matching based on the size of the first encoded code block, wherein the first code block is encoded by using a complete matrix of the LDPC code; or the first encoded code block is obtained by encoding the first code block using the parity check matrix of the LDPC code, where the parity check matrix of the LDPC code is determined based on the size of the first encoded code block.

In the foregoing implementation, if the complete matrix of the LDPC code includes a column of built-in puncture bits, or the parity check matrix of the LDPC code includes a column of built-in puncture bits, the first encoded code block does not include coded bits corresponding to the column of built-in puncture bits. The column of built-in puncture bits is generally a column with a heavy column weight in the complete matrix or the parity check matrix of the LDPC code.

In any implementation of the method, if $n_i \geq N_{CB}$, the first encoded code block is obtained by encoding using a matrix that includes column 0 to column $N_{CB}-1$ of a parity check matrix obtained by lifting an LDPC base matrix of the first code block based on the lifting factor z; or if $n_i < N_{CB}$ and $S_i+n_i-1 < N_{CB}$, coded bit $S_i$ to coded bit $(S_i+n_i-1)$ in the first encoded code block are coded bits corresponding to column $S_i$ to column $(S_i+n_i-1)$ in a parity check matrix obtained by lifting an LDPC base matrix of the first code block based on the lifting factor z; or if $n_i < N_{CB}$ and $S_i+n_i-1 \geq N_{CB}$, coded bit $S_i$ to coded bit $(N_{CB}-1)$ in the first encoded code block are coded bits corresponding to column $S_i$ to column $(N_{CB}-1)$ in a parity check matrix obtained by lifting an LDPC base matrix of the first code block based on the lifting factor z, and coded bit 0 to coded bit $(n_i-(N_{CB}-1-S_i))$ in the first encoded code block are coded bits corresponding to column 0 to column $n_i-(N_{CB}-1-S_i)$ in the check matrix obtained by lifting the LDPC base matrix of the first code block based on the lifting factor z.

When encoding is performed in such a manner, a length of a bit segment that is coded each time may be equal to a quantity of actually sent bits, thereby reducing encoding complexity of the sending device.

Further, in another possible implementation of the foregoing aspect, the receiving device determines a code rate of the soft buffer for decoding; determines a first parity check matrix based on the code rate for decoding; and decodes the soft buffer by using the first parity check matrix, to obtain the first code block. Because the receiving device may select, based on the code rate for decoding, the parity check matrix for decoding, decoding complexity is reduced.

According to a third aspect, a sending device is provided, configured to send a first transport block, where the first transport block includes a first code block, and the sending device includes:

a rate matcher, configured to obtain a coded bit segment from a first encoded code block, where the first encoded code block is obtained after the first code block is processed based on a processing capability of a receiving device; and a transceiver, configured to send the coded bit segment to the receiving device.

The sending device may be configured to perform the method in the foregoing aspect. For details, refer to the descriptions in the foregoing aspect.

In a possible design, the sending device provided in this application may include modules corresponding to behaviors of the sending device in the foregoing method design. The module may be software and/or hardware.

According to a fourth aspect, a receiving device is provided, including:

a transceiver, configured to receive a coded bit segment from a sending device;

a rate dematcher, configured to combine soft channel bits of the coded bit segment, with soft channel bits in a soft buffer of the receiving device and save the combined soft channel bits in the soft buffer of the receiving device; and a decoder, configured to perform LDPC decoding on the soft buffer to obtain a first code block, where the coded bit segment is obtained by the sending device from a first encoded code block, and the first encoded code block is obtained after the sending device processes the first code block based on a processing capability of the receiving device.

The receiving device may be configured to perform the method in the foregoing aspect. For details, refer to the descriptions in the foregoing aspect.

In a possible design, the receiving device provided in this application may include modules corresponding to behaviors of the receiving device in the foregoing method design. The module may be software and/or hardware.

According to a fifth aspect, a data transmission method is provided, applied to a communications system using LDPC code, where the communications system includes a sending device and a receiving device, and the data transmission method includes:

obtaining, by the sending device, a to-be-sent redundancy version $RV_j$;

determining, by the sending device, a first start position $S_i$ of a coded bit segment in a first encoded code block based on the redundancy version $RV_j$;

obtaining, by the sending device as the coded bit segment, a coded bit segment having a length of $n_i$ from the first start position $S_i$ in the first encoded code block; and sending, by the sending device, the coded bit segment, where i is an integer greater than or equal to 0, when i is 0, it indicates initial transmission, and when i is greater than 0, it indicates the $i^{th}$ retransmission; and j is an integer, and $0 \leq j < j_{max}$, where $j_{max}$ is a maximum quantity of redundancy versions between the sending device and the receiving device, start positions corresponding to the $j_{max}$ redundancy versions are distributed in the first encoded code block at an equal interval, a start position of $RV_0$ is a position of bit p in the first encoded code block, and p is an integer greater than or equal to 0.

According to a sixth aspect, a data transmission method is provided, applied to a communications system using LDPC code, where the communications system includes a sending device and a receiving device, and the data transmission method includes:

determining, by the sending device, a first start position $S_i$ of a coded bit segment in a first encoded code block;

obtaining, by the sending device as the coded bit segment, a coded bit segment having a length of $n_i$ from the first start position $S_i$ in the first encoded code block; and sending, by the sending device, the coded bit segment, where i is an integer greater than or equal to 0;

if i=0, it indicates initial transmission, and $S_0$ is a position of bit p of the first encoded code block; or if i>0, it indicates the $i^{th}$ retransmission, and $S_i=(S_{i-1}+n_{i-1})\% N_{CB}$, where $S_{i-1}$ is a start position corresponding to an obtained coded bit segment that is previously sent, and $n_{i-1}$ is a length of the obtained coded bit segment that is previously sent; or $S_i=(p+i*n_0)\% N_{CB}$, where $n_0$ is a length of an obtained coded bit segment that is sent for initial transmission, and $n_i=n_0$.

According to a seventh aspect, a data transmission method is provided, applied to a communications system using low-density parity-check LDPC code, where the communications system includes a sending device and a receiving device, and the method includes:

obtaining, by the receiving device, a to-be-sent redundancy version $RV_j$;

determining, by the receiving device based on the redundancy version $RV_j$, a first start position $S_i$ in a soft buffer for soft channel bits of a coded bit segment; and combining, by the receiving device, the soft channel bits of the coded bit segment with soft channel bits starting from the first start position $S_i$ in the soft buffer, and save the combined soft channel bits in the soft buffer starting from the first start position $S_i$, where a quantity of the soft channel bits is $n_i$, where i is an integer greater than or equal to 0, when i is 0, it indicates initial transmission, and when i is greater than 0, it indicates the $i^{th}$ retransmission; and j is an integer, and $0 \leq j < j_{max}$, where $j_{max}$ is a maximum quantity of redundancy versions between the sending device and the receiving device, start locations corresponding to the $j_{max}$ redundancy versions are distributed in the soft buffer at an equal interval, a start position of $RV_0$ is a position of soft channel bit p in the soft buffer, and p is an integer greater than or equal to 0.

According to an eighth aspect, a data transmission method is provided, applied to a communications system using low-density parity-check LDPC code, where the communications system includes a sending device and a receiving device, and the method includes:

determining, by the receiving device, a first start position $S_i$ in a soft buffer for soft channel bits of a coded bit segment; and combining, by the receiving device, the soft channel bits of the coded bit segment with soft channel bits starting from the first start position $S_i$ in the soft buffer, and saving the combined soft channel bits in the soft buffer starting from the first start position $S_i$, where a quantity of the soft channel bits is $n_i$, where i is an integer greater than or equal to 0;

if i=0, it indicates initial transmission, and $S_0$ is a position of soft channel bit p in the soft buffer; or if i>0, it indicates the $i^{th}$ retransmission, and $S_i=(S_{i-1}+n_{i-1})\% N_{CB}$, where $S_{i-1}$ is a start position of soft channel bits of a previously received coded bit segment, and $n_{i-1}$ is a quantity of the soft channel bits of the previously received coded bit segment; or $S_i=(p+i*n_0)\% N_{CB}$, where $n_0$ is a quantity of soft channel bits of a coded bit segment received during initial transmission, and $n_i=n_0$.

Optionally, in the fifth aspect to the eighth aspect, $p=z \cdot l$, where z is an lifting factor of an LDPC parity check matrix corresponding to the first encoded code block, and l is a positive integer.

In the foregoing implementation, a start position of a coded bit segment in an initial transmission or retransmission may be flexibly determined.

In any implementation of the seventh or eighth aspect, optionally, the sending device may flexibly select a matrix used for encoding, to match a size of the first encoded code block, and the first encoded code block is obtained by performing matching based on the size of the first encoded code block after the first code block is encoded by using a complete matrix of the LDPC code; or the first encoded code block is obtained after the first code block is encoded by using the parity check matrix of the LDPC code, where the parity check matrix of the LDPC code is determined based on the size of the first encoded code block. For how to determine the size of the first encoded code block, refer to the implementations of the first to fourth aspects.

In the foregoing implementation, if the complete matrix of the LDPC code includes a column of built-in puncture bits, or the parity check matrix of the LDPC code includes a column of built-in puncture bits, the first encoded code block does not include coded bits corresponding to the column of built-in puncture bits. The column of built-in puncture bits is generally a column with a heavy column weight in the integrated matrix or the parity check matrix of the LDPC code.

In any implementation of the method, if $n_i \geq N_{CB}$, the first encoded code block is obtained by encoding using a matrix including column 0 to column $N_{CB}-1$ of a parity check matrix obtained by lifting an LDPC base matrix of the first code block based on the lifting factor z; or if $n_i < N_{CB}$ and $S_i+n_i-1 < N_{CB}$, coded bit $S_i$ to coded bit $(S_i+n_i-1)$ in the first encoded code block are coded bits corresponding to column $S_i$ to column $S_i+n_i-1$ in a check matrix obtained after an LDPC basis matrix of the first code block is expanded based on the expansion factor z; or if $n_i < N_{CB}$ and $S_i+n_i-1 \geq N_{CB}$, coded bit $S_i$ to coded bit $(N_{CB}-1)$ in the first encoded code block are coded bits corresponding to column $S_i$ to column $(N_{CB}-1)$ in a parity check matrix obtained by lifting an LDPC base matrix of the first code block based on the lifting factor z, and coded bit 0 to coded bit $(n_i-(N_{CB}-1-S_i))$ in the first encoded code block are coded bits corresponding to column 0 to column $(n_i-(N_{CB}-1-S_i))$ in the parity check matrix obtained by lifting the LDPC base matrix of the first code block based on the lifting factor z.

When encoding is performed in such a manner, a length of a bit segment that is coded each time may be equal to a quantity of actually sent bits, thereby reducing encoding complexity of the sending device.

According to a ninth aspect, a sending device is provided, including:
- a rate matcher, configured to: obtain a to-be-sent redundancy version $RV_j$;
  determine a first start position $S_i$ of a coded bit segment in a first encoded code block based on the redundancy version $RV_j$; and
  obtain, as the coded bit segment, a coded bit segment having a length of $n_i$ from the first start position $S_i$ in the first encoded code block, where
  i is an integer greater than or equal to 0, when i is 0, it indicates initial transmission, and when i is greater than 0, it indicates the $i^{th}$ retransmission; and
  j is an integer, and $0 \leq j < j_{max}$, where $j_{max}$ is a maximum quantity of redundancy versions between the sending device and the receiving device, start positions corresponding to the $j_{max}$ redundancy versions are distributed in the first encoded code block at an equal interval, a start position of $RV_0$ is a position of bit p in the first encoded code block, and p is an integer greater than or equal to 0; and
- a transceiver, configured to send the coded bit segment to the receiving device.

The sending device may be configured to perform the method in the fifth aspect. For details, refer to the descriptions in the foregoing aspect.

According to a tenth aspect, a sending device is provided, including:
- a rate matcher, configured to: determine a first start position $S_i$ of a coded bit segment in a first encoded code block; and
  obtain, as the coded bit segment, a coded bit segment having a length of $n_i$ from the first start position $S_i$ in the first encoded code block, where
  i is an integer greater than or equal to 0;
  if i=0, it indicates initial transmission, and $S_0$ is a position of bit p of the first encoded code block; or
  if i>0, it indicates the $i^{th}$ retransmission, and
  $S_i = (S_{i-1} + n_{i-1}) \% N_{CB}$, where $S_{i-1}$ is a start position corresponding to an obtained coded bit segment that is previously sent, and $n_{i-1}$ is a length of the obtained coded bit segment that is previously sent; or
  $S_i = (p + i*n_0) \% N_{CB}$, where $n_0$ is a length of an obtained coded bit segment that is sent during initial transmission, and $n_i = n_0$; and
- a transceiver, configured to send the coded bit segment to a receiving device.

The sending device may be configured to perform the method in the sixth aspect. For details, refer to the descriptions in the foregoing aspect.

In a possible design, each sending device provided in this application may include modules corresponding to behaviors of the sending device in the foregoing method design. The module may be software and/or hardware.

According to an eleventh aspect, a receiving device is provided, including:
- a transceiver, configured to receive a coded bit segment from a sending device; and
- a rate dematcher, configured to: obtain a to-be-sent redundancy version $RV_j$;
  determine, based on the redundancy version $RV_j$, a first start position $S_i$ in a soft buffer for soft channel bits of a coded bit segment; and
  combine the soft channel bits of the coded bit segment with soft channel bits starting from the first start position $S_i$ in the soft buffer, and save the combined soft channel bits in the soft buffer starting from the first start position $S_i$, where a quantity of the soft channel bits is $n_i$, where
  i is an integer greater than or equal to 0, when i is 0, it indicates initial transmission, and when i is greater than 0, it indicates the $i^{th}$ retransmission; and
  j is an integer, and $0 \leq j < j_{max}$, where $j_{max}$ is a maximum quantity of redundancy versions between the sending device and the receiving device, start positions corresponding to the $j_{max}$ redundancy versions are distributed in the soft buffer at an equal interval, a start position of $RV_0$ is a position of soft channel bit p in the soft buffer, and p is an integer greater than or equal to 0.

The receiving device may be configured to perform the method in the seventh aspect. For details, refer to the descriptions in the foregoing aspect.

According to a twelfth aspect, a receiving device is provided, including:
- a transceiver, configured to receive a coded bit segment from a sending device; and
- a rate dematcher, configured to: determine a first start position $S_i$ in a soft buffer for soft channel bits of a coded bit segment; and
  combine the soft channel bits of the coded bit segment with soft channel bits starting from the first start position $S_i$ in the soft buffer, and save the combined soft channel bits in the soft buffer starting from the first start position $S_i$, where a quantity of the soft channel bits is $n_i$, where
  i is an integer greater than or equal to 0;
  if i=0, it indicates initial transmission, and $S_0$ is a position of soft channel bit p in the soft buffer; or
  if i>0, it indicates the $i^{th}$ retransmission, and
  $S_i = (S_{i-1} + n_{i-1}) \% N_{CB}$, where $S_{i-1}$ is a start location of soft channel bits of a previously received coded bit segment, and $n_{i-1}$ is a quantity of the soft channel bits of the previously received coded bit segment; or
  $S_i = (p + i*n_0) \% N_{CB}$, where $n_0$ is a quantity of soft channel bits of a coded bit segment received during initial transmission, and $n_i = n_0$.

The receiving device may be configured to perform the method in the eighth aspect. For details, refer to the descriptions in the foregoing aspect.

In a possible design, each receiving device provided in this application may include modules corresponding to behaviors of the receiving device in the foregoing method design. The modules may be software and/or hardware.

According to a thirteenth aspect, an embodiment of the present invention provides a communications system, where the system includes the sending device and the receiving device that are described in the foregoing aspects.

According to another aspect, an embodiment of the present invention provides a computer storage medium, where the computer storage medium includes a program designed to perform the foregoing aspects.

For the method, the sending device, the receiving device, and the communications system of the embodiments of the present invention, the LDPC code is used as a channel coding scheme, a size of an encoded code block is properly determined based on the processing capability of the receiving device, and a to-be-sent coded bit segment is selected.

Therefore, storage overheads of the receiving device can be reduced, and decoding complexity of the receiving device can be reduced.

BRIEF DESCRIPTION OF DRAWINGS

Figure 1:
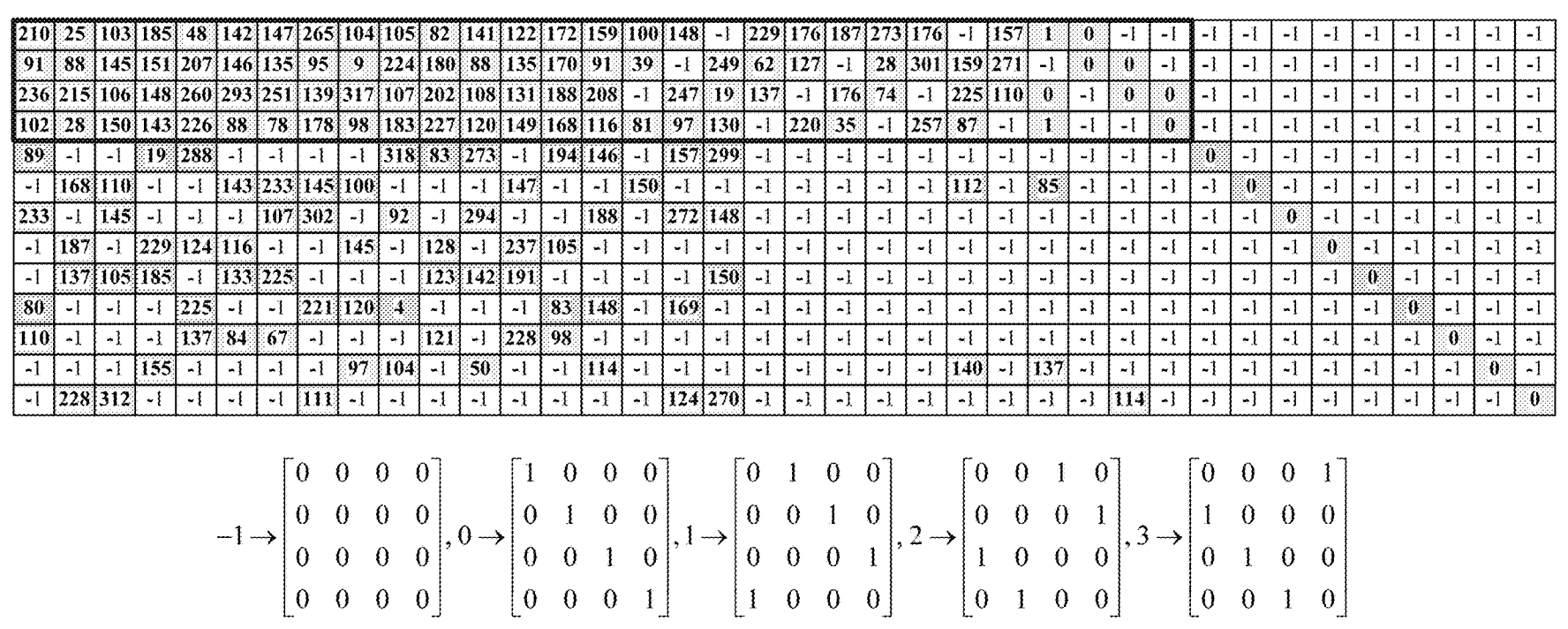

FIG. 1 is a schematic diagram of a base matrix of an LDPC code and circular permutation matrices of the LDPC code;

DESCRIPTION OF EMBODIMENTS

The following clearly describes the technical solutions in the embodiments of the present invention with reference to the accompanying drawings in the embodiments of the present invention. Apparently, the described embodiments are merely some rather than all of the embodiments of the present invention. All other embodiments obtained by a person of ordinary skill in the art based on the embodiments of the present invention without creative efforts shall fall within the protection scope of the present invention.

Figure 2:
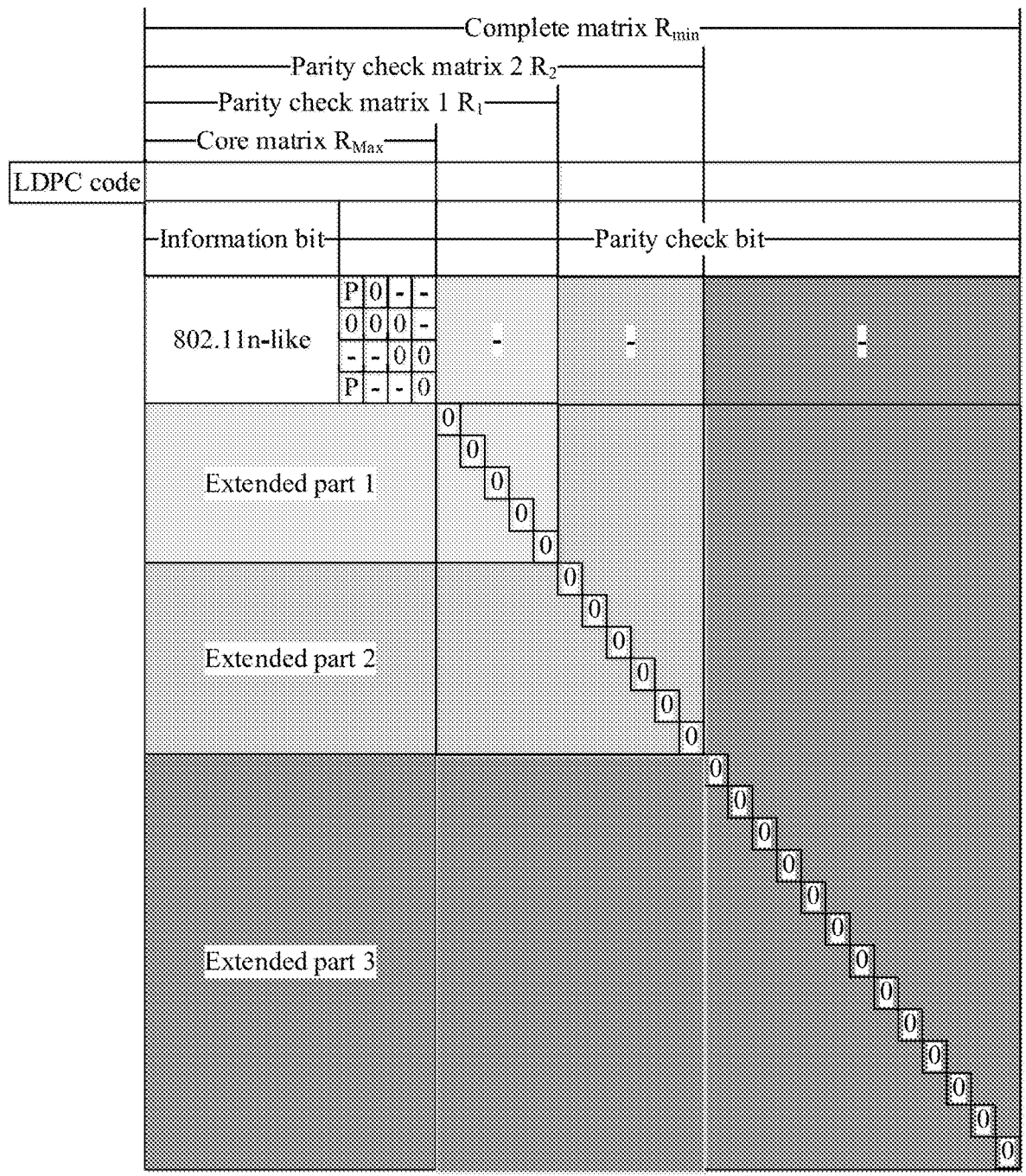
FIG. 2 is a schematic structural diagram of a parity check matrix of LDPC code.
Figure 3:
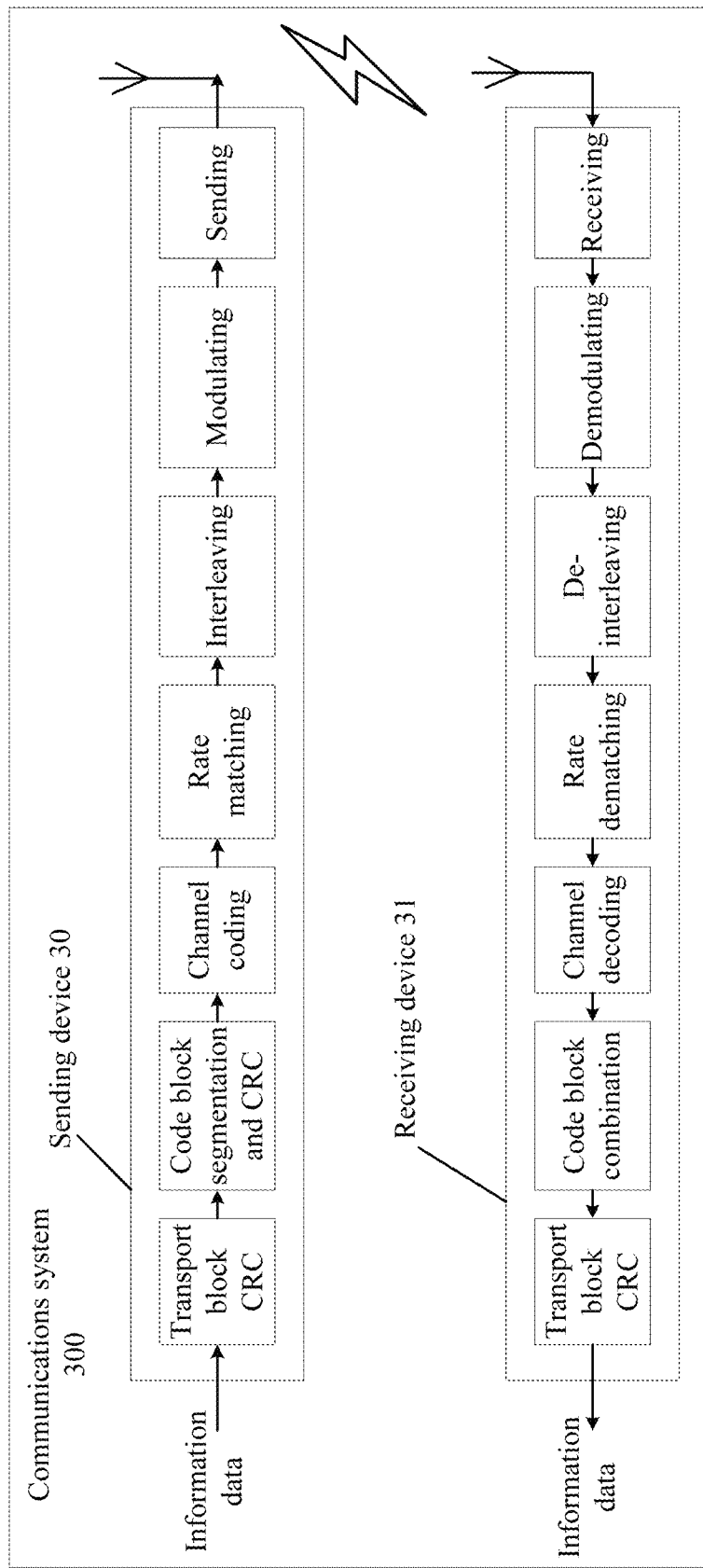
FIG. 3 is a structural diagram of a communications system according to an embodiment of the present invention.

As shown in FIG. 3, a communications system 300 includes a sending device 30 and a receiving device 31. When sending information data, the sending device 30 divides the information data into a plurality of transport blocks (TB) based on supported sizes of transport blocks, and performs CRC attachment to each transport block. If a size of a transport block after CRC attachment exceeds a maximum code block length, the transport block needs to be segmented into several code blocks (CB), and code block CRC bits may be attached to each code block, further filler bits may be inserted to each code block. The sending device 30 performs channel coding on each code block, for example, performs LDPC coding, to obtain a corresponding encoded code block. Each encoded code block includes a plurality of to-be-encoded information bits and a plurality of parity check bits generated through encoding, and the to-be-encoded information bits and the parity check bits are collectively referred to as coded bits.

The encoded code block is saved in a circular buffer of the sending device 30 after subblock interleaving is performed on the encoded code block. The sending device 30 selects a segment of coded bits from the circular buffer and sends the segment of coded bits, that is, obtains a coded bit segment, interleaves the coded bit segment, maps the interleaved coded bit segment to modulation symbols, and sends the modulation symbols. When performing retransmission, the sending device 30 selects another coded bit segment from the circular buffer and sends the another coded bit segment. If all data in the circular buffer has been transmitted, the sending device 30 returns to a front end of the circular buffer to send coded bits again.

After demodulating and de-interleaving the received modulation symbols, the receiving device 31 saves soft values of the received coded bit segment at a corresponding position in a soft buffer. If retransmission occurs, the receiving device 31 combines soft values of a coded bit segment that is retransmitted each time with the soft values in the soft buffer, and saves the combined soft values in the soft buffer. The combination herein is: If positions of coded bits received in two transmission are the same, soft values of the coded bits received in the two transmission are combined. The receiving device 31 decodes all the soft values in the soft buffer, to obtain code blocks of the information data.

It should be noted that, in the embodiments of the present invention, the sending device 30 may be a network device in the communications system, for example, a base station, and the receiving device 31 may be correspondingly a terminal. For ease of understanding, the following describes some terms used in this application.

In this application, terms "network" and "system" are often used interchangeably. However, a person skilled in the art can understand meanings of the "network" and the "system". The terminal is a device having a communication function, and may include a handheld device having a wireless communication function, an in-vehicle device, a wearable device, a computing device, another processing device that is connected to a wireless modem, or the like. The terminal may have different names in different networks, such as user equipment, a mobile station, a subscriber unit, a station, a cellular phone, a personal digital assistant, a wireless modem, a wireless communications device, a handheld device, a laptop computer, a cordless phone, and a wireless local loop. For ease of description, the terminal is used for short in this application. The base station (BS) may also be referred to as a base station device, and is a device that is deployed on a radio access network and is configured to provide a wireless communication function. The base station may have different names in different wireless access systems. For example, a base station in a Universal Mobile Telecommunications System (UMTS) network is referred to as a NodeB, a base station in an LTE network is referred to as an evolved NodeB (eNB, or eNodeB), and a base station in a $5^{th}$ Generation network may have another name. The present invention is not limited thereto.

Figure 4:
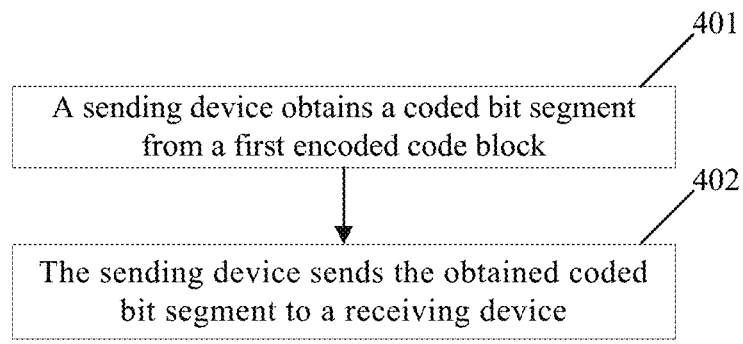
FIG. 4 is a flowchart of a data transmission method according to another embodiment of the present invention.

FIG. 4 is a flowchart of a data transmission method according to an embodiment of the present invention. The method may be applied to a communications system using LDPC code, and the communications system includes a sending device 30 and a receiving device 31. The method includes the following steps.

401. The sending device 30 obtains a coded bit segment from a first encoded code block.

The sending device 30 may be configured to send a data transport block, for example, a first transport block. The first transport block may be segmented into at least one code block. The first encoded code block may be obtained after the sending device 30 processes a code block, for example, a first code block, in the first transport block based on a processing capability of the receiving device 31. For example, the sending device 30 determines a size of the first encoded code block based on the processing capability of the receiving device 31, and the sending device 30 encodes the first code block by using an LDPC complete matrix, to obtain a second encoded code block, and then performs matching on the second encoded code block based on the size of the first encoded code block, to obtain the first encoded code block. For another example, the sending device 30 determines a size of the first encoded code block based on the processing capability of the receiving device 31, and the sending device 30 determines an LDPC parity check matrix based on the size of the first encoded code block, and performs LDPC encoding on the first code block by using the parity check matrix, to obtain the first encoded code block.

Further, if the LDPC complete matrix includes a column of built-in puncture bits, coded bits that correspond to the column of built-in puncture bits and that are in the second encoded code block are deleted, in other words, coded bits obtained by encoding the first code block by using the column of built-in puncture bits are deleted; then the first encoded code block is obtained by performing matching based on the size of the first encoded code block. In other words, the first encoded code block does not include the coded bits corresponding to the column of built-in puncture bits. Alternatively, if the LDPC parity check matrix includes a column of built-in puncture bits, coded bits corresponding to the column of built-in puncture bits need to be deleted from an encoded code block obtained by encoding the first code block by using the LDPC parity check matrix, to obtain the first encoded code block. In other words, the first encoded code block does not include the coded bits corresponding to the column of built-in puncture bits. It can be learned that a size of the code block obtained by performing encoding by using the LDPC parity check matrix is greater than the size of the first encoded code block, so that the size of the code block is equal to the size of the first encoded code block after the coded bits corresponding to the column of built-in puncture bits are deleted.

The column of built-in puncture bits is generally a column with a heavy column weight in the LDPC complete matrix or the LDPC parity check matrix.

402. The sending device 30 sends the coded bit segment obtained in step 401 to the receiving device 31.

The processing capability of the receiving device 31 may be based on a size of a register, a capability of a decoder, and the like. The processing capability of the receiving device 31 may include, but is not limited to, at least one of the following: a maximum transport block size $N_{IR}$ that can be supported by a soft buffer of the receiving device 31, a minimum code rate $R_t$ for decoding supported by the decoder, and a maximum encoded code block size $N_{CB,t}$ supported by the receiving device 31. Different values of these processing capabilities may be expressed by using different levels of the receiving device 31. For example, the processing capability of the receiving device 31 is the maximum transport block size $N_{IR}$ that can be supported by the soft buffer of the receiving device 31. When a level of the receiving device 31 is 1, the maximum transport block size $N_{IR}$ that can be supported by the soft buffer of the receiving device 31 is 250,000 bits. When the level is 2, the maximum transport block size $N_{IR}$ that can be supported by the soft buffer is 1,000,000 bits. It should be noted that the foregoing example is merely used for ease of description, and the present invention is not limited thereto. If $N_{CB}$ represents the size of the first encoded code block, the size $N_{CB}$ of the first encoded code block may be determined by using any one of the following formulas:

$$N_{CB} = \min\left(K_W, \left\lfloor \frac{N_{IR}}{C} \right\rfloor\right); \text{ or}$$

$$N_{CB} = \min\left(K_W, \left\lfloor \frac{K_{IR,send}}{C \cdot R_t} \right\rfloor\right); \text{ or}$$

$$N_{CB} = \min(K_W, N_{CB,t}),$$

where
$K_w$ is a size of a circular buffer of the sending device 30, C is a quantity of code blocks included in the first transport block, $K_{IR,send}$ is a size of the first transport block, $\lfloor \bullet \rfloor$ is rounding down, and $\min(\bullet)$ is used to get a minimum value of an element in brackets.

It can be learned that the size of the first encoded code block is less than or equal to the size of the circular buffer of the sending device 30, the first encoded code block obtained by encoding the first code block by using the LDPC parity check matrix is saved in the circular buffer, a part that is of the circular buffer and that saves the first encoded code block may also be referred to as a virtual buffer, and the size of the first encoded code block may also be a size of the virtual buffer of the sending device 30.

If the processing capability of the receiving device 31 is limited, the sending device 30 determines a size of an encoded code block for initial transmission or retransmission based on the processing capability of the receiving device 31, and selects a to-be-sent coded bit segment. Therefore, storage overheads of the receiving device 31 can be reduced, and decoding complexity of the receiving device 31 can be reduced.

For an encoder of the sending device 30, an output code rate of the encoder depends on the size of the first encoded code block and a size of the first code block. For example, for $N_{CB}=\min(K_W, N_{CB,t})$, $N_{CB}$ is limited by the maximum encoded code block size $N_{CB,t}$ supported by the receiving device 31. Therefore, the output code rate of the encoder is determined based on the size of the first code block. A larger size of the first code block leads to a higher output code rate of the encoder. A smaller size of the first code block leads to a lower output code rate of the encoder.

The sending device 30 interleaves the obtained coded bit segment, maps the interleaved coded bit segment to modulation symbols, and sends the modulation symbols to the receiving device 31. Further, the sending device 30 may further puncture the obtained coded bit segment, to increase the code rate.

In an embodiment of the present invention, a sending device 30 may first determine a to-be-sent redundancy version $RV_j$, then determine a first start position $S_i$ of a to-be-obtained coded bit segment in a first encoded code block based on the redundancy version $RV_j$, and obtain the coded bit segment starting from the first start position $S_i$ in the first encoded code block, where i is an integer greater than or equal to 0, when i is 0, it indicates initial transmission, and when i is greater than 0, it indicates the $i^{th}$ retransmission; and $0 \leq j < j_{max}$, where $j_{max}$ is a maximum quantity of redundancy versions between the sending device 30 and a receiving device 31. It should be noted that the first encoded code block herein may be an encoded code block obtained by processing a first code block based on the method of the embodiment shown in FIG. 4, or may be an encoded code block obtained by processing a first code block in another manner.

When a communications system supports retransmission, the sending device 30 and the receiving device 31 negotiate use of redundancy versions, and use of a redundancy version when retransmission is performed each time. Each redundancy version may be used to indicate a start position of the coded bit segment in the first encoded code block, and the sending device 30 obtains the coded bit segment from the start position. A decoding success rate of the receiving device 31 can be improved by sending different coded bit segments in an encoded code block each time. To enable the obtained coded bit segment that is sent each time to be close or equal in length, start positions corresponding to the $j_{max}$ redundancy versions may be distributed at different positions in the first encoded code block, and are commonly distributed at an equal interval. For initial transmission of the first encoded code block, the sending device 30 usually uses a redundancy version $RV_0$. A start position $S_0$ of $RV_0$ may be a position of bit p in the first encoded code block. Herein, p is an integer greater than or equal to 0.

Figure 5:
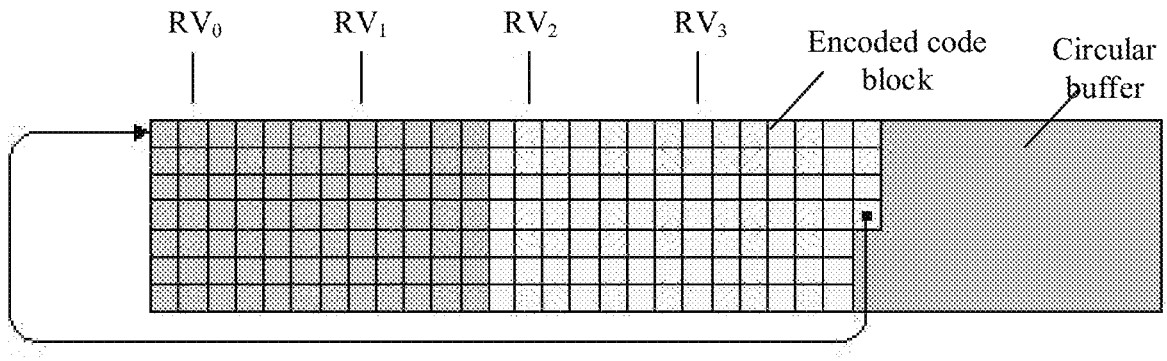
FIG. 5 is a schematic diagram of a first encoded code block according to another embodiment of the present invention.

A schematic diagram of a first encoded code block shown in FIG. 5 is used as an example. A length of the first encoded code block is 179 bits. After the first encoded code block is written into a circular buffer column by column, seven rows and 26 columns are obtained. Starting from a position of column 0 and row 0, the start position corresponding to $RV_0$ is column 1 and row 0, that is, bit 7; a start position corresponding to $RV_1$ is column 7 and row 0, that is, bit 49; a start position corresponding to $RV_2$ is column 13 and row 0, that is, a bit 91; a start position corresponding to $RV_3$ is column 19 and row 0, that is, a bit 133. It can be learned that the redundancy versions are distributed at an equal interval. If the redundancy version used for sending is $RV_0$, the sending device 30 sequentially reads, column by column, a coded bit segment starting from column 1, that is, reads a coded bit segment having a length of 42 bits starting from the bit 7. If the redundancy version used for sending is $RV_3$, the sending device 30 sequentially reads, column by column, a coded bit segment starting from column 19. It should be noted that after reading a final bit, the sending device 30 still needs to continue returning to a start position of the circular buffer to read column 0 and row 0. In other words, the sending device 30 reads a coded bit segment having a length of 53 bits in total. It should be noted that the foregoing example is merely used for convenience. The present invention is not limited thereto.

In another embodiment of the present invention, a sending device 30 may alternatively determine a start position $S_i$ of an obtained coded bit segment for currently transmission and that is in a first encoded code block based on a start position corresponding to an obtained coded bit segment and a length of the obtained coded bit segment for previous transmission. If i=0, in other words, the sending device 30 initially transmits the first encoded code block, $S_0$ may be a position of bit p in the first encoded code block. Herein, p is an integer greater than or equal to 0. If i>0, in other words, the sending device 30 needs to retransmit the first encoded code block, then $S_i=(S_{i-1}+n_{i-1})\% N_{CB}$; or if each coded bit segment for initial transmission or retransmission in the first encoded code block is equal in length, $S_i=(p+i*n_0)\% N_{CB}$, where $n_0$ is a length of an obtained coded bit segment that is sent during initial transmission. It should be noted that the first encoded code block herein may be an encoded code block obtained by processing a first code block based on the method of the embodiment shown in FIG. 4, or may be an encoded code block obtained by processing a first code block in another manner.

In the foregoing embodiments, because a size of the LDPC parity check matrix of the first encoded code block is determined based on an lifting factor z, the start $n_0 S_0=p$ of the initially transmitted coded bit segment may be determined based on the lifting factor of the LDPC parity check matrix of the first encoded code block. For example, $p=z \cdot l$, where l is a positive integer, and may be usually set to 1, 2, or 3. An encoded code block shown in FIG. 5 is used as an example, z=7, and l=1. In other words, the lifting factor of the LDPC parity check matrix corresponding to the first encoded code block is 7, and l=1, which indicates that column 0 is punctured, and a coded bit segment is obtained starting from column 1 for initial transmission. It should be noted that the example is merely used for description herein. This embodiment of the present invention is not limited thereto.

Because the coded bit segment for initial transmission or retransmission may be flexibly selected, a decoding success rate may be further improved.

Optionally, based on the method of each of the foregoing embodiments, in the communications system in which LDPC encoding is performed, the first encoded code block may be obtained in a plurality of manners.

In an embodiment of the present invention, after determining a size $N_{CB}$ of a first encoded code block, a sending device 30 may process a first code block based on the size of the first encoded code block, to obtain the first encoded code block. In this manner, rate matching is not coupled to channel coding.

For example, the sending device 30 may encode the first code block by using a complete matrix of LDPC code, to obtain a second encoded code block, and then perform matching based on the size of the first encoded code block, to obtain the first encoded code block. For example, $N_{CB}$ bits between coded bit 0 and coded bit ($N_{CB}-1$) in the second encoded code block may be used as the first encoded code block.

For another example, the sending device 30 may alternatively determine a parity check matrix of LDPC code based on the size of the first encoded code block, for example, may determine an LDPC parity check matrix in which a quantity of columns is less than or equal to $N_{CB}$, and encode the first code block by using the parity check matrix, to obtain the first encoded code block.

It should be noted that the foregoing example is merely used for ease of description. This embodiment of the present invention is not limited thereto.

In another embodiment of the present invention, channel coding and rate matching may be alternatively coupled together. After a length $n_i$ of a to-be-sent coded bit segment and a start position $S_i$ of the coded bit segment in a first encoded code block are determined during rate matching, LDPC encoding is performed on a code block during channel coding based on the length $n_i$ of the coded bit segment and the start position $S_i$ of the coded bit segment in the first encoded code block, to obtain the first encoded code block, so as to obtain the to-be-sent coded bit segment.

If the length $n_i$ of the to-be-sent coded bit segment is greater than or equal to $N_{CB}$, in this case, a size of the first encoded code block is less than or equal to the length of the to-be-sent coded bit segment. Therefore, a first code block may be encoded by selecting column 0 to column ($N_{CB}-1$) in a parity check matrix obtained after a base matrix is lifted based on a lifting factor z, to obtain the first encoded code block. For the to-be-sent coded bit segment, $n_i$ coded bits may be obtained starting from the start position $S_i$ in the first encoded code block. If bit ($N_{CB}-1$) is obtained, obtaining continues starting from a position of bit 0, until a quantity of obtained bits is equal to the length $n_i$ of the coded bit segment. For example, the size $N_{CB}$ of the first encoded code block is 200, the length $n_i$ of the to-be-sent coded bit segment is 400, and the start position $S_i$ is 100. In this case, the coded bit segment is a coded bit segment that includes coded bit 100 to coded bit 199, coded bit 0 to coded bit 199, and coded bit 0 to coded bit 99. It should be noted that the example is merely used for description herein. The present invention is not limited thereto.

If the length $n_i$ of the to-be-sent coded bit segment is less than $N_{CB}$, and $S_i+n_i-1<N_{CB}$, coded bit $S_i$ to coded bit $(S_i+n_i-1)$ in the first encoded code block are coded bits corresponding to column $S_i$ to column $(S_i+n_i-1)$ in a parity check matrix obtained after a base matrix is lifted based on an lifting factor z. In a possible implementation, a parity check matrix including column $S_i$ to column $(S_i+n_i-1)$ in the parity check matrix obtained after the base matrix is lifted based on the lifting factor z may be selected to encode a first code block, to obtain an encoded code block, and the coded bit $S_i$ to the coded bit $(S_i+n_i-1)$ are coded bits corresponding to column $S_i$ to column $(S_i, +n_i-1)$ in the parity check matrix obtained after the base matrix is lifted based on the lifting factor z. In another possible implementation, alternatively, a matrix portion corresponding to column $S_i$ to column $(S_i+n_i-1)$ in the parity check matrix obtained by lifting the base matrix based on the lifting factor z may be selected to encode a first code block, to obtain $n_i$ coded bits. The $n_i$ bits may also be referred to as coded bits corresponding to column $S_i$ to column $(S_i+n_i-1)$ in the parity check matrix obtained by lifting the base matrix based on the lifting factor z.

If the length $n_i$ of the to-be-sent coded bit segment is less than $N_{CB}$, and $S_i+n_i-1>N_{CB}$, coded bit $S_i$ to coded bit $(N_{CB}-1)$ in the first encoded code block are coded bits corresponding to column $S_i$ to column $(N_{CB}-1)$ in a parity check matrix obtained after a base matrix is lifted based on a lifting factor z, and coded bit 0 to coded bit $(n_i-(N_{CB}-1-S_i))$ in the first encoded code block are coded bits corresponding to column 0 to column $(n_i-(N_{CB}-1-S_i))$ in the parity check matrix obtained after the base matrix is lifted based on the lifting factor z. For an implementation thereof, refer to the foregoing embodiment.

In the foregoing embodiment, because a quantity of coded bits is equal to a quantity of bits that are actually to be sent, invalid encoding operations of the sending device 30 can be reduced.

Figure 6:
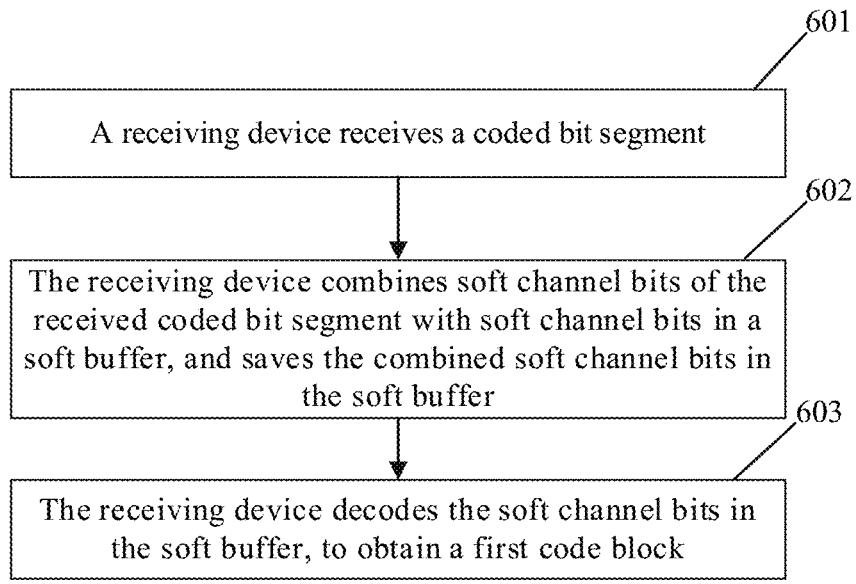
FIG. 6 is a flowchart of a data transmission method according to another embodiment of the present invention.

FIG. 6 is a flowchart of a data transmission method according to an embodiment of the present invention. The method may be applied to a communications system using LDPC code, and the communications system includes a sending device 30 and a receiving device 31. The method includes the following steps.

601. The receiving device 31 receives a coded bit segment.

The coded bit segment received by the receiving device 31 is obtained by the sending device 30 from a first encoded code block, and the first encoded code block is obtained after the sending device 30 processes a first code block based on a processing capability of the receiving device 31. Therefore, the coded bit segment received by the receiving device 31 does not go beyond the processing capability of the receiving device 31.

For the processing capability of the receiving device 31 and a size of the first encoded code block, specifically refer to the foregoing embodiment. Details are not described herein again.

602. The receiving device 31 combines soft channel bits of the coded bit segment received in step 601 with soft channel bits in a soft buffer of the receiving device 31, and save the combined soft channel bits in the soft buffer of the receiving device 31.

The soft buffer of the receiving device 31 is configured to save soft channel bits (soft channel bit) of coded bits. For example, a coded bit sent by the sending device 30 is 1, and after the coded bit is transmitted through a channel, a soft channel bit that corresponds to the coded bit and that is obtained by the receiving device 31 is 1.45. If a position of the coded bit in the first encoded code block is bit 5, soft channel bit 5 in the soft buffer of the receiving device 31 is 1.45. It should be noted that the example is merely used for description herein. This embodiment of the present invention is not limited thereto.

It can be learned that a position of each soft channel bit in the soft buffer of the receiving device 31 is in a one-to-one correspondence with a position of each coded bit of the first encoded code block.

In an embodiment of the present invention, a receiving device 31 obtains a to-be-sent redundancy version $RV_j$, and determines, based on the redundancy version $RV_j$, a first start position $S_i$ in a soft buffer for soft channel bits of a coded bit segment. The receiving device 31 combines the soft channel bits of the coded bit segment with soft channel bits starting from the first start position $S_i$ in the soft buffer, and saves the combined soft channel bits in the soft buffer starting from the first start position $S_i$, where a quantity of the soft channel bits is $n_i$. Herein, i is an integer greater than or equal to 0, when i is 0, it indicates initial transmission, and when i is greater than 0, it indicates the $i^{th}$ retransmission; and j is an integer, and $0 \leq j < j_{max}$, where $j_{max}$ is a maximum quantity of redundancy versions between a sending device 30 and the receiving device 31, start positions corresponding to the $j_{max}$ redundancy versions are distributed in the soft buffer at an equal interval, a start position of $RV_0$ is a position of soft channel bit p in the soft buffer, and p is an integer greater than or equal to 0.

In another embodiment of the present invention, a receiving device 31 determines a first start position $S_i$ of received soft channel bits in a soft buffer, combines the received soft channel bits with soft channel bits in the soft buffer starting from the first start position $S_i$, and saves the combined soft channel bits in the soft buffer starting from the first start position $S_i$, where a quantity of the soft channel bits is $n_i$; i is an integer greater than or equal to 0; if i=0, it indicates initial transmission, and $S_0$ is a position of soft channel bit p in the soft buffer; or if i>0, it indicates the $i^{th}$ retransmission, and $S_i=(S_{i-1}+n_{i-1})\% N_{CB}$, where $S_{i-1}$ is a start position of previously received soft channel bits, and $n_{i-1}$ is a quantity of the previously received soft channel bits; or $S_i=+i*n_0)\% N_{CB}$, where $n_0$ is a quantity of soft channel bits received during initial transmission, and $n_i=n_0$.

For that the receiving device 31 determines the start position of the soft channel bits of the received coded bit segment, refer to the descriptions of the foregoing embodiment. Details are not described herein again.

If the coded bit segment obtained by the sending device 30 includes n coded bits, the receiving device 31 may obtain n corresponding soft channel bits. If the receiving device 31 receives coded bits at a same position twice, the receiving device 31 combines the received soft channel bits in two receptions. For example, if a soft channel bit received for a first time is 1.45, and a soft channel bit received for a second time is 0.5, 1.95 is obtained after the two soft channel bits are combined. It should be noted that the example is merely used for description herein. The present invention is not limited thereto.

603. The receiving device 31 decodes the soft channel bits in the soft buffer, to obtain a first code block.

Because the soft buffer saves the soft channel bits that are combined once or repeatedly, when performing decoding each time, the receiving device 31 needs to determine a code rate of the soft channel bits saved in the soft buffer for decoding, and determines an LDPC parity check matrix based on the code rate for decoding. The LDPC parity check matrix herein is a first parity check matrix. The parity check matrix does not need to be completely the same as a parity check matrix used when the sending device 30 encodes the first code block. However, when there are a few soft channel bits, a size of the parity check matrix is correspondingly relatively small, so that decoding complexity of the receiving device 31 can be reduced.

The receiving device 31 decodes the soft channel bits in the soft buffer by using the first parity check matrix, to obtain the first code block. If the decoding succeeds, the receiving device 31 obtains the first code block, and sends an acknowledgement (ACK) to the sending device 30. After receiving the ACK, the sending device 30 may not retransmit the first encoded code block, and continue to process a next code block. If the decoding fails, the receiving device 31 sends a negative acknowledgement (NACK) to the sending device 30. After receiving the NACK, the sending device 30 performs retransmission if a maximum quantity of retransmission times is not exceeded, selects a coded bit segment from the first encoded code block, and sends the coded bit segment to the receiving device 31.

Based on the method provided in this embodiment of the present invention, the sending device 30 determines a size of an encoded code block based on the processing capability of the receiving device 31 for initial transmission or retransmission of the encoded code block, and selects a to-be-sent coded bit segment. Therefore, storage overheads of the receiving device 31 can be reduced, and decoding complexity of the receiving device 31 can be reduced.

Figure 7:
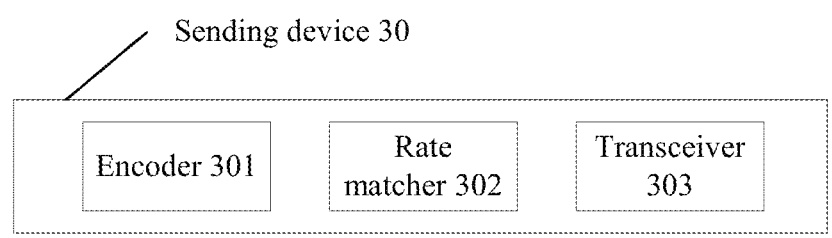
FIG. 7 is a structural diagram of a sending device according to another embodiment of the present invention.

FIG. 7 is a schematic structural diagram of a sending device. The sending device may be applied to the communications system shown in FIG. 3. The sending device 30 may include one or more transceivers 303, and the transceiver 303 may also be referred to as a transceiver unit, a transceiver machine, a transceiver circuit, or the like. The transceiver 303 is mainly configured to receive and send a radio frequency signal, for example, configured to send the coded bit segment in the foregoing embodiment to a receiving device 31. An encoder 301 is mainly configured to encode information data. A rate matcher 302 is mainly configured to select a to-be-sent coded bit segment, for example, configured to select a coded bit segment from the first encoded code block in the foregoing embodiment. The sending device 30 may further include other components, such as a component configured to generate a transport block CRC, a component configured to perform code block segmentation and CRC attachment, an interleaver, and a modulator, and the other components may be separately configured to implement a function of each part of the sending device 30 in FIG. 3.

In an example, the rate matcher 302 may include a memory 3021 and a processor 3022. The memory 3021 is configured to store a necessary instruction and necessary data. For example, the memory 3021 stores the first encoded code block in the foregoing embodiment. The processor 3022 is configured to perform a necessary action based on the instruction stored in the memory 3021, for example, configured to: control the sending device to perform an action shown in FIG. 4, control the encoder 301 to perform LDPC encoding on a first code block based on a processing capability of the receiving device 31, and control the rate matcher 302 to obtain a coded bit segment from the first encoded code block.

It should be noted that the sending device 30 may include one or more memories and one or more processors, to implement a function of each part of the sending device in FIG. 3. A memory and a processor may be independently disposed on each component, or a plurality of components share a same memory and processor.

Figure 8:
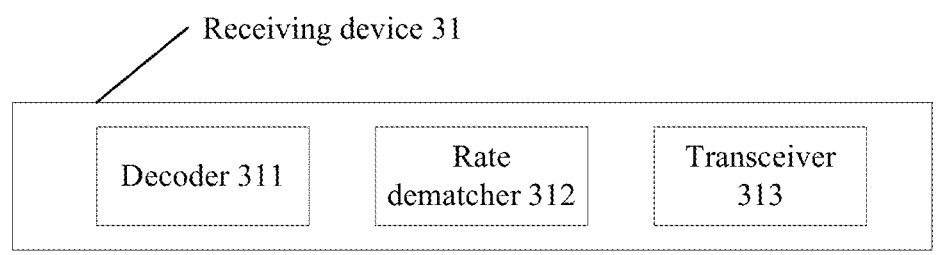
FIG. 8 is a structural diagram of a receiving device according to another embodiment of the present invention.

FIG. 8 is a schematic structural diagram of a receiving device. The receiving device may be applied to the communications system shown in FIG. 3. The receiving device 31 may include one or more transceivers 313, and the transceiver 313 may also be referred to as a transceiver unit, a transceiver machine, a transceiver circuit, or the like. The transceiver 313 is mainly configured to receive and send a radio frequency signal, for example, configured to receive the coded bit segment in the foregoing embodiment sent by a sending device 30. A decoder 311 is mainly configured to decode a received signal, for example, configured to decode soft channel bits in a soft buffer. A rate dematcher 312 is mainly configured to combine the soft channel bits, for example, configured to combine soft channel bits of the coded bit segment in the foregoing embodiment, and save the combined soft channel bits in the soft buffer. The receiving device 31 may further include other components, such as a component configured to perform a CRC check on a transport block, a component configured to perform code block combination, a deinterleaver, and a demodulator, and the other devices may be separately configured to implement a function of each part of the receiving device 31 in FIG. 3.

In an example, the rate dematcher 312 may include a memory 3121 and a processor 3122. The memory 3121 is configured to store a necessary instruction and necessary data. For example, the memory 3121 stores the soft channel bits in the foregoing embodiment. The processor 3122 is configured to perform a necessary action based on the instruction stored in the memory 3121, for example, configured to: control the receiving device to perform an action shown in FIG. 6, control the rate dematcher 312 to combine and save the soft channel bits, and control the decoder 311 to perform LDPC decoding on the soft channel bits.

It should be noted that the receiving device 31 may include one or more memories and one or more processors, to implement a function of each part of the receiving device in FIG. 3. A memory and a processor may be independently disposed on each components, or a plurality of components share a same memory and processor.

A person skilled in the art may further understand that various illustrative logical blocks (illustrative logical block) and steps (step) that are listed in the embodiments of the present invention may be implemented by using electronic hardware, computer software, or a combination thereof. Whether the functions are implemented by using hardware or software depends on particular applications and a design requirement of the entire system. A person skilled in the art may use various methods to implement the described functions for each particular application, but it should not be considered that the implementation goes beyond the scope of the embodiments of the present invention.

The various illustrative logical units and circuits described in the embodiments of the present invention may implement or operate the described functions by using a general purpose processor, a digital signal processor, an application-specific integrated circuit (ASIC), a field programmable gate array (FPGA) or another programmable logical apparatus, a discrete gate or transistor logic, a discrete hardware component, or a design of any combination thereof. The general purpose processor may be a microprocessor. Optionally, the general purpose processor may also be any conventional processor, controller, microcontroller, or state machine. The processor may also be implemented by a combination of computing apparatuses, such as a digital signal processor and a microprocessor, a plurality of microprocessors, one or more microprocessors with a digital signal processor core, or any other similar configuration.

Steps of the methods or algorithms described in the embodiments of the present invention may be directly embedded into hardware, a software unit executed by a processor, or a combination thereof. The software unit may be stored in a RAM memory, a flash memory, a ROM memory, an EPROM memory, an EEPROM memory, a register, a hard disk, a removable magnetic disk, a CD-ROM, or a storage medium of any other form in the art. For example, the storage medium may be connected to a processor so that the processor may read information from the storage medium and write information to the storage medium. Optionally, the storage medium may further be integrated into a processor. The processor and the storage medium may be arranged in an ASIC, and the ASIC may be disposed in UE. Optionally, the processor and the storage medium may be disposed in different components of the UE.

With descriptions of the foregoing embodiments, a person skilled in the art may clearly understand that the present invention may be implemented by hardware, firmware, or a combination thereof. When the present invention is implemented by software, the foregoing functions may be stored in a computer readable medium or transmitted as one or more instructions or code in the computer readable medium. The computer readable medium includes a computer storage medium and a communications medium, where the communications medium includes any medium that enables a computer program to be transmitted from one place to another. The storage medium may be any available medium accessible to a computer. The following provides an example but does not impose a limitation: The computer readable medium may include a RAM, a ROM, an EEPROM, a CD-ROM, or another optical disc storage or a disk storage medium, or another magnetic storage device, or any other medium that can carry or store expected program code in a form of an instruction or a data structure and can be accessed by a computer. In addition, any connection may be appropriately defined as a computer readable medium. For example, if software is transmitted from a website, a server, or another remote source by using a coaxial cable, an optical fiber cable, a twisted pair, a digital subscriber line (DSL), or wireless technologies such as infrared ray, radio, and microwave, the coaxial cable, optical fiber cable, twisted pair, DSL, or wireless technologies such as infrared ray, radio, and microwave are included in a definition of a medium to which they belong. For example, a disk (Disk) and disc (disc) used by the present invention includes a compact disc (CD), a laser disc, an optical disc, a digital versatile disc (DVD), a floppy disk, and a Blu-ray disc, where the disk generally copies data by a magnetic means, and the disc copies data optically by a laser. The foregoing combination should also be included in the protection scope of the computer readable medium.

In summary, what is described above is merely example embodiments of the technical solutions of the present invention, but is not intended to limit the protection scope of the present invention. Any modification, equivalent replacement, improvement, or the like made without departing from the principle of the present invention shall fall within the protection scope of the present invention.

What is claimed is:

1. A data transmission method, comprising:
    encoding, by a sending device, a first code block by using a low density parity check (LDPC) matrix, to obtain a second encoded code block;
    obtaining, by the sending device, a first encoded code block to be saved in a circular buffer in the sending device based on the second encoded code block, wherein
    the first encoded code block comprises multiple redundancy versions for transmission, and a size of the first encoded code block is determined based on a processing capability of a receiving device, and the first encoded code block does not include coded bits in the second encoded code block which correspond to a column of built-in puncture bits in the LDPC matrix;
    obtaining, by the sending device, a coded bit segment as a redundancy version from the first encoded code block; and
    sending, by the sending device, the coded bit segment to the receiving device.

2. The method according to claim 1, wherein the LDPC matrix is a complete matrix.

3. The method according to claim 1, wherein the LDPC matrix is a parity check matrix which is determined according to the size of the first encoded code block, and the size of the parity check matrix is less than a size of a complete matrix.

4. The method according to claim 1, wherein:
    the processing capability of the receiving device comprises a maximum transport block size $N_{IR}$ that can be supported by a soft buffer of the receiving device, and the size of the first encoded code block is $$N_{CB} = \min\left(K_W, \left\lfloor \frac{N_{IR}}{C} \right\rfloor\right),$$

wherein the first code block is one of C code blocks in a first transport block, and a size of a circular buffer of the sending device is $K_w$; or
    the processing capability of the receiving device comprises a minimum code rate $R_t$ for decoding supported by the receiving device, and the size of the first encoded code block is $$N_{CB} = \min\left(K_W, \left\lfloor \frac{K_{IR,send}}{C \cdot R_t} \right\rfloor\right),$$

wherein the first code block is one of C code blocks in a first transport block, $K_{IR,send}$ is a size of the first transport block, and a size of a circular buffer of the sending device is $K_w$; or
    the processing capability of the receiving device comprises a maximum encoded code block size $N_{CB,t}$ supported by the receiving device, and the size of the first encoded code block is $N_{CB}=\min(K_w, N_{CB,t})$, wherein a size of a circular buffer of the sending device is $K_w$.

5. The method according to claim 1, wherein the obtaining, by the sending device, the coded bit segment from the first encoded code block, comprises:
   obtaining, by the sending device, a to-be-sent redundancy version $RV_j$;
   determining, by the sending device, a first start position $S_i$ of a coded bit segment in the first encoded code block based on the redundancy version $RV_j$; and
   obtaining, by the sending device as the coded bit segment, a coded bit segment having a length of $n_i$ from the first start position $S_i$ in the first encoded code block, wherein:
   i is an integer greater than or equal to 0, when i is 0, it indicates initial transmission, and when i is greater than 0, it indicates the $i^{th}$ retransmission; and
   j is an integer, and $0 \le j \le j_{max}$, wherein $j_{max}$ is a maximum quantity of redundancy versions between the sending device and the receiving device.

6. The method according to claim 5, wherein a start position of $RV_0$ is a position of bit p in the first encoded code block, and p is an integer greater than or equal to 0.

7. The method according to claim 6, wherein $p=z\cdot l$, z is a lifting factor of the parity check matrix or z is a lifting factor of the complete matrix, corresponding to the first encoded code block, and l is a positive integer.

8. The method according to claim 1, wherein the sending, by the sending device, the coded bit segment to the receiving device, comprises:
   interleaving, by the sending device, the coded bit segment;
   mapping, by the sending device, the interleaved coded bit segment to modulation symbols; and
   sending, by the sending device, the modulation symbols.

9. A device using a low-density parity-check (LDPC) code, comprising:
   a transceiver;
   one or more memories configured to store program instructions; and
   one or more processors coupled to the one or more memories and configured to execute the program instructions;
   wherein, when executed by the one or more processors, the program instructions cause the one or more processors to:
   encode a first code block by using a low density parity check (LDPC) matrix, to obtain a second encoded code block;
   based on the second encoded code block, obtain a first encoded code block to be saved in a circular buffer, wherein
   the first encoded code block comprises multiple redundancy versions for transmission, and a size of the first encoded code block is determined based on a processing capability of a receiving device, and the first encoded code block does not include coded bits in the second encoded code block which correspond to a column of built-in puncture bits in the LDPC matrix;
   obtain a coded bit segment as a redundancy version from the first encoded code block; and
   send the coded bit segment to the receiving device.

10. The device according to claim 9, wherein the LDPC matrix is a complete matrix.

11. The device according to claim 9, wherein the LDPC matrix is a parity check matrix which is determined according to the size of the first encoded code block, and the size of the parity check matrix is less than a size of a complete matrix.

12. The device according to claim 9, wherein:
   the processing capability of the receiving device comprises a maximum transport block size $N_{IR}$ that can be supported by a soft buffer of the receiving device, and the size of the first encoded code block is $$N_{CB} = \min\left(K_W, \left\lfloor \frac{N_{IR}}{C} \right\rfloor\right),$$

wherein the first code block is one of C code blocks in a first transport block, and a size of a circular buffer of the device is $K_w$; or
   the processing capability of the receiving device comprises a minimum code rate $R_t$ for decoding supported by the receiving device, and the size of the first encoded code block is $$N_{CB} = \min\left(K_W, \left\lfloor \frac{K_{IR,send}}{C \cdot R_t} \right\rfloor\right),$$

wherein the first code block is one of C code blocks in a first transport block includes C code blocks, $K_{IR,send}$ is a size of the first transport block, and a size of a circular buffer of the device is $K_w$; or
   the processing capability of the receiving device comprises a maximum encoded code block size $N_{CB,t}$ supported by the receiving device, and the size of the first encoded code block is $N_{CB}=\min(K_w, N_{CB,t})$, wherein a size of a circular buffer of the device is $K_w$.

13. The device according to claim 9, wherein the program instructions further cause the one or more processors to:
   obtain a to-be-sent redundancy version $RV_j$;
   determine a first start position $S_i$ of a coded bit segment in the first encoded code block based on the redundancy version $RV_j$; and
   obtain, as the coded bit segment, a coded bit segment having a length of $n_i$ from the first start position $S_i$ in the first encoded code block, wherein:
   i is an integer greater than or equal to 0, when i is 0, it indicates initial transmission, and when i is greater than 0, it indicates the $i^{th}$ retransmission; and
   j is an integer, and $0 \le j \le j_{max}$, wherein $j_{max}$ is a maximum quantity of redundancy versions between the sending device and the receiving device.

14. The device according to claim 13, wherein a start position of $RV_0$ is a position of bit p in the first encoded code block, and p is an integer greater than or equal to 0.

15. The device according to claim 9, wherein $p=z\cdot l$, z is a lifting factor of the parity check matrix or z is a lifting factor of the complete matrix, corresponding to the first encoded code block, and l is a positive integer.

16. The device according to claim 9, wherein the program instructions further cause the device to:
   interleave the coded bit segment;
   map the interleaved coded bit segment to modulation symbols; and
   send the modulation symbols.

* * * * *